Feb. 3, 1970 R. A. HANSEN 3,493,961

CIRCUIT FOR SELECTIVELY ALTERING THE SLOPE OF RECURRING RAMP SIGNALS

Filed May 27, 1966

INVENTOR.
ROBERT A. HANSEN
BY John V. Regan
ATTORNEY

United States Patent Office 3,493,961
Patented Feb. 3, 1970

3,493,961

CIRCUIT FOR SELECTIVELY ALTERING THE SLOPE OF RECURRING RAMP SIGNALS

Robert A. Hansen, Burlington, Mass., assignor to RCA Corporation, a corporation of Delaware Filed May 27, 1966, Ser. No. 553,500
Int. Cl. H04l 3/00; H03k 13/00
U.S. Cl. 340—347 10 Claims

ABSTRACT OF THE DISCLOSURE

A circuit for altering the slope of a recurring ramp signal produced by a ramp generator to maintain a predetermined relationship between the ramp signal and a reference signal at a preselected point on the ramp signal. The ramp signal is compared at the preselected point with the reference, and the resulting difference signal is used to control an integrating means. An output signal from the integrating means is summed with the reference signal to produce a slope control signal for the ramp generator.

This invention relates to analog-to-digital converter systems. More particularly, the present invention relates to an analog-to-digital conversion system using an input signal amplitude to time interval conversion technique.

In the field of data handling, it is often desirable to express to digital form an analog quantity representing a physical parameter for recording, display or subsequent digital computer applications. A prior art electrical analog time interval encoder has a predetermined ramp voltage generator, comparison means for establishing a time interval during which the ramp voltage reaches the level of the analog input signal and counting means for counting the number of reference clock pulses which occur during the time interval. This prior art system has an inherent accuracy of conversion which is dependent directly on the accuracy of the slope of the voltage ramp signal and the frequency of the reference clock pulses. In other words, there is no correlation between the slope of the ramp and the frequency of clock pulses. Thus, in the prior art system, each clock pulse may not represent the same number of reference voltage units.

An object of the present invention is to provide an improved analog-to-digital encoder.

Another object of the present invention is to provide an improved analog-to-digital encoder using the time interval conversion technique.

A further object of the present invention is to provide an improved time interval analog-to-digital encoder having a self-calibrating capability for the slope of an internally generated ramp signal.

Still another object of the present invention is to provide an improved time interval analog-to-digital encoder having a self-calibrating capability wherein the slope of a ramp signal is correlated with the frequency of an internal clock generator to provide a constant voltage to time ratio.

In accomplishing these and other objects, there has been provided, in accordance with the present invention, an analog-to-digital encoder having a first comparison means for comparing an input analog signal with a sawtooth reference signal. The comparison means is arranged to establish a time interval during which a counter counts internal clock pulses and to effectively terminate the counting operation at the end of the time interval as determined by an equality between the input signal and the reference signal. The reference signal is internally modified by a feedback control circuit to provide a constant sawtooth signal level at a predetermined pulse time. The slope of the sawtooth is adjusted by controlling a sawtooth generator until the sawtooth level matches a reference signal level at the preselected pulse time.

Figure 1:
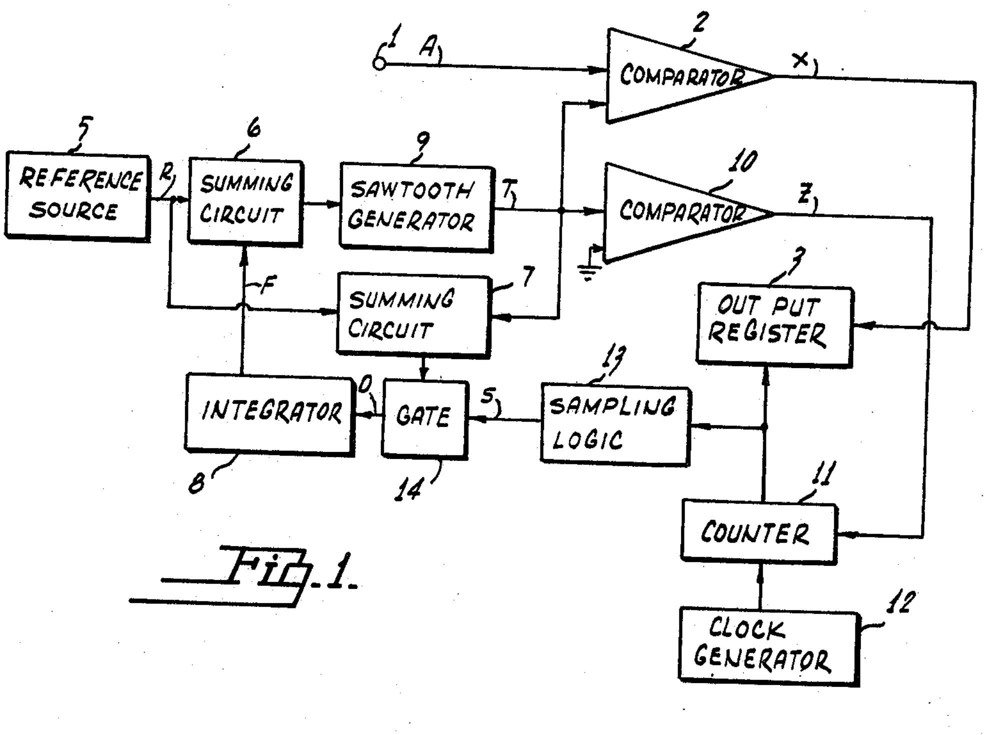
Figure 2:
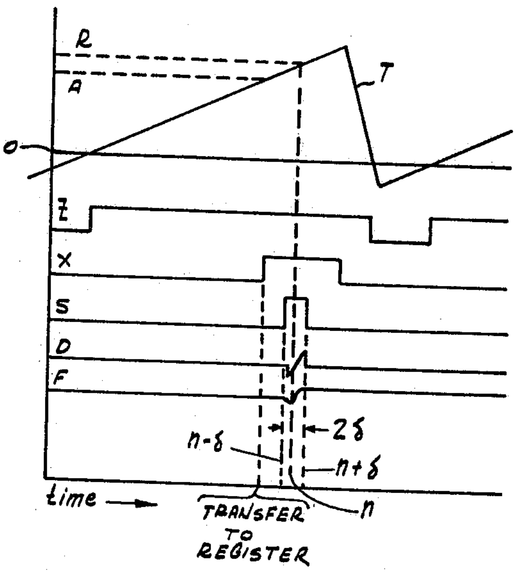

A better understanding of the present invention may be had when the following detailed description is read in connection with the accompanying drawings, in which:

FIGURE 1 is a block diagram of an analog-to-digital encoder embodying the present invention; and FIGURE 2 is a typical waveshape found in the encoder shown in FIGURE 1.

Referring to FIGURE 1 in more detail, there is shown an analog-to-digital converter embodying the present invention and having an input signal terminal 1 arranged to be connected to a source of an analog signal which is to be converted. The terminal 1 is connected to one side of a signal comparator 2. The comparator 2 may be any suitable device which is effective to compare two input signals and to produce an output signal upon an equality occurring therebetween. The other input signal for comparator 2 is obtained from a reference signal circuit described hereinafter. The aforesaid output signal from the first comparator 2 is applied to an output register 3 to control the transfer of digital information thereto representative of the encoded digital valve of the input analog signal.

A reference signal source 5 is used to provide a predetermined reference signal which is applied as a first input signal to a pair of conventional summing circuits 6 and 7 operative to algebraically sum their input signals. The output signal from the first summing circuit is representative of the algebraic sum between the aforesaid first input signal and a second input signal applied from an integrator circuit 8. This output signal is applied to a well-known ramp, or sawtooth, generator 9 which is operative to provide a periodic sawtooth signal having a slope which is dependent on the amplitude of an input signal supplied by the summing circuit 6. This sawtooth signal is applied as the second input signal to the first comparator 2, to the second summing circuit 7 and as a first input signal to a second comparator 10 similar to the first comparator 2. The second input signal to the second comparator 10 is a reference level which may be a ground connection as shown in FIGURE 1. The output signal from the second comparator 10 is applied to a suitable counter 11 to control the time at which the counter 11 begins to count input pulses of a predetermined frequency from a clock generator 12.

A conventional sampling logic 13 is operative to pick out a predetermined group of the counted pulses from the output of the counter 11 which output, also, is applied to the output register 3. The selected counter signals are applied to selectively operate a gate circuit 14. The gate 14 is selectively controlled by these counter signals to apply the output signal from the second summing circuit 7 as an input signal to the integrator 8.

In operation, the circuit of the present invention is effective to convert the amplitude of an analog input signal applied to input terminal 1 to a time interval represented by a count in the counter 11 of clock pulses from the clock 12. When the ramp signal from the generator 9 passes through "zero," it is effective to generate a "start" output signal from the second comparator 10 since the comparator is comparing it with a ground level. This "start" signal is applied to the counter 11 to start the counting operation of the clock pulses. Concurrently, the first comparator 2 is comparing the input analog signal with the ramp signal from the generator 9. When an equality is sensed by the first comparator 2, a control, or strobe, signal is applied to the output register 3 to effect a transfer to register 3 of the count in the counter 11 at that instant.

Prior art devices which used a ramp comparison technique did not correlate the slope of the ramp with the clock frequency. Thus, in these prior art systems, the change in slope of the ramp due to component instability produced inaccuracies in the conversion operation since each clock pulse did not represent the same number of amplitude units of the ramp signal. The present invention is effective to provide a constant ratio of amplitude units per clock pulse; e.g., millivolts per pulse. The slope of the ramp signal produced by the generator 9 is controlled by the amplitude of the input signal applied thereto. This input signal is obtained from the algebraic sum of the reference signal from the source 5 and the output signal from the integrator 8. These signals are arranged to have opposite polarities to produce a difference signal at the output of the first summing circuit 6.

The output signal from the integrator 8, is, in turn, controlled by an output signal from the second summing circuit 7. The input signals to this summing circuit, i.e., the output signals from the generator 9 and the source 5, are, also, arranged to have opposite polarities to produce a difference output signal from the second summing circuit 7. This difference signal is gated by gate 14 to the input circuit of the integrator 8 to be integrated thereby. This gating operation is performed near the end of the ramp by selecting a group of clock pulses occurring at the desired time to control the gate 14. Specifically, the selected pulses are arranged to give a switching operation between $n-\Delta$ and $n+\Delta$ where $n$ is the time at which the ramp should be equal to the reference signal from the source 5. Accordingly, a gating operation at this time is effective to apply the difference signal from the second summing circuit 7 to the integrator 8. Since the two input signals to the second summing circuit 7 are of opposite polarity, the difference signal will have equal positive and negative levels only when the reference signal is actually equal to the ramp signal at the selected $n$ time. Otherwise, an excess of either a positive or negative signal will be applied to the integrator 8 to produce an integrator output signal which has a positive or negative remainder signal after integration. This remainder is used to modify the reference signal applied to the sawtooth generator 9 to change the ramp slope for the next cycle of the sawtooth.

For a clock frequency of P pulses per second, the elapsed time to complete a pulse is:

$$t_n=\frac{n \text{ pulses}}{\text{P pulses/sec.}}=\text{sec.}$$

For a sawtooth slope of K, the elapsed time to reach R is:

$$t_r=\frac{R \text{ volts}}{K \text{ volts/sec.}}=\text{sec.}$$

The system of the present invention will stabilize at a point where the correction voltage F does not change from one sawtooth cycle to the next. This point occurs when the sawtooth has a slope which provides a voltage equal to the reference voltage at the $n$ pulse time:

$$t_n=t_r$$

$$n/P=R/K$$

Since $n$ is a fixed number of pulses and R is a constant reference voltage:

$$\frac{n}{R}=\text{constant}=\frac{P}{K}$$

so that the system is self-calibrating for:

The illustrative waveshapes shown in FIGURE 2 are found in the circuit of FIGURE 1 at the points corresponding to the letter reference of FIGURE 1 for a condition when the slope of the sawtooth is too high and the reference voltage is reached too soon. The ramp signal T is found at the output of the generator 9. The input level A is shown to determine an illustrative point on the ramp at which the ramp signal is equal to the input signal. The equality between the R level signal from the reference source 5 and the ramp signal T is arranged to fall near the end of a ramp signal during which time, indicated at $n$, the adjustment of the ramp slope is effected without interfering with the preceding input signal comparison operation. The output signal from the comparator 10 is labeled Z and starts and stops at the zero axis crossings of the ramp signal T. This signal is applied to the counter 11 to control the counting operation and reset of the counter 10.

The X output signal from the comparator 2 starts at the time of the equality between the ramp signal T and the input signal A to effect a transfer between the counter 11 and the register 3. This signal is arranged to reset at an arbitrary time after the peak of the ramp signal T. The S signal shown in FIGURE 2 is shown in simplified form as a selected pulse from the counter output signals. The S signal is arranged to open the gate circuit 14 to apply the difference signal from the summing circuit 7 to be applied to the integrator 8. In illustration of FIGURE 2, this gated signal D is shown as an unbalanced signal to indicate an incorrect slope from the generator 9. A correct slope would produce equal areas under the curve on both sides of the time at which the reference signal R is equal to the ramp signal T. Specifically, these waveshapes indicate an excessive slope of the ramp T signal. The output signal F from the integrator 8 is thereby adjusted to have an unbalanced waveshape with a positive excess which is used to modify the effect of the reference signal R by the operation of the summing circuit 6.

Accordingly, it may be seen that there has been provided, in accordance with the present invention, an analog-to-digital converter using an amplitude to time interval conversion and having an inherent self-calibrating capability to eliminate the effect of internal drift on the conversion operation.

What is claimed is:

1. In an analog-to-digital converter system having a sawtooth generator arranged to produce a ramp signal having a slope determined by an input signal applied thereto, comparison means operative to compare an input analog signal with said ramp signal and to produce an output signal indicative of an equality therebetween, clock generator means arranged to produce pulses of predetermined frequency and counter means arranged to count said pulses, the improvement comprising a source of reference signal, and a feedback circuit operative to compare the amplitude of said ramp signal and said reference signal at a predetermined time corresponding to the occurrence of at least one of said pulses applied to said counter means and to adjust the slope of said ramp signal by controlling said input signal to said sawtooth generator during said ramp signal being compared to maintain a predetermined relationship between said ramp signal and said reference signal at said predetermined time.

2. In an analog-to-digital converter system as set forth in claim 1, and including an additional source of reference signal, and a second comparison means arranged to compare said ramp signal with said reference signal from said additional source and to start said counter means to count said pulses upon the detection of a predetermined relationship between the compared signals, and wherein said feedback circuit includes a first algebraic summing means arranged to alebraically sum said ramp signal and said first-mentioned reference signal to produce a control signal, integrator means, signal gating means arranged to apply said control signal to said integrator means at a predetermined time represented by the occurrence of one of said pulses and second algebraic summing means arranged to algebraically sum an output signal from said integrator means and said first-mentioned reference signal to produce a ramp control signal as said said input signal to said sawtooth generator whereby to affect the slope of said ramp signal.

3. A combination comprising a sawtooth generator arranged to produce a variable slope ramp signal in response to an input ramp control signal applied thereto, and feedback means arranged to produce said ramp control signal comprising a source of a reference signal and control means connected to the input of said sawtooth generator and operative to compare said ramp signal with said reference signal at a preselected sampling point on said ramp signal and to vary said ramp control signal during said ramp signal being compared in a direction to produce a predetermined relationship between said ramp signal and said reference signal at said sampling point.

4. In an analog-to-digital converter as set forth in claim 1 wherein said feedback circuit includes a summing means arranged to sum said ramp signal and said reference signal to produce a control signal and ramp control means arranged to respond to said control signal to affect said input signal to said sawtooth generator.

5. In an analog-to-digital converter as set forth in claim 4 wherein said summing means is an algebraic summing means.

6. In an analog-to-digital converter as set forth in claim 4 wherein said ramp control means includes an integrator means, signal gating means arranged to apply said control signal as an input signal to said integrator means at a predetermined time represented by the occurrence of one of said pulses and second summing means arranged to sum an output signal from said integrator means and said first-mentioned source of reference signal to produce said input signal to said sawtooth generator whereby to affect the slope of said ramp signal.

7. In an analog-to-digital converter as set forth in claim 6 wherein said first-mentioned summing means and said second summing means are each algebraic summing means.

8. A combination as set forth in claim 3 wherein said comparison means includes summing means arranged to sum said ramp signal and said reference signal to produce a control signal and ramp control means arranged to respond to said control signal to produce said ramp control signal.

9. A combination as set forth in claim 8 wherein said ramp control means includes an integrator means, signal gating means arranged to apply said control signal as an input signal to said integrator means at said sampling point and second summing means arranged to sum an output signal from said integrator means and said first-mentioned source of reference signal to produce said ramp control signal.

10. A combination as set forth in claim 9 wherein said first-mentioned summing means and said second summing means are algebraic summing means.

References Cited

UNITED STATES PATENTS

| | | | |
|---|---|---|---|
| 3,049,625 | 8/1962 | Brockman | 328—185 X |
| 3,148,366 | 9/1964 | Schulz | 340—347 |
| 3,175,161 | 3/1965 | Hackborn et al. | 328—185 |
| 3,200,338 | 8/1965 | Ellis | 328—185 X |
| 3,217,271 | 11/1965 | Autorino et al. | 328—185 X |

MAYNARD R. WILBUR, Primary Examiner

M. K. WOLENSKY, Assistant Examiner

U.S. Cl. X.R.

328—185; 307—228

UNITED STATES PATENT OFFICE
CERTIFICATE OF CORRECTION

Patent No. 3,493,961 Dated February 3, 1970

Inventor(s) Robert A. Hansen

It is certified that error appears in the above-identified patent and that said Letters Patent are hereby corrected as shown below:

Column 3, line 66, after "for:" insert --- $\frac{\text{R volts}}{\text{n pulse}}$.---.

SIGNED AND SEALED
AUG 11 1970

(SEAL)
Attest:

Edward M. Fletcher, Jr.
Attesting Officer

WILLIAM E. SCHUYLER, JR.
Commissioner of Patents

FORM PO-1050 (10-69)

USCOMM-DC 60376-P69
☆ U.S. GOVERNMENT PRINTING OFFICE : 1969 O—366-334